(12) United States Patent
Jung et al.

(10) Patent No.: US 9,672,893 B2
(45) Date of Patent: Jun. 6, 2017

(54) SEMICONDUCTOR DEVICE CONFIGURED TO GENERATE A REFRESH PULSE FOR EXECUTING A REFRESH OPERATION IN RESPONSE TO THE DECODED COUNT SIGNAL AND TEMPERATURE CODE

(71) Applicant: SK hynix Inc., Icheon-si, Gyeonggi-do (KR)

(72) Inventors: Chul Moon Jung, Icheon-si (KR); Mi Hyun Hwang, Icheon-si (KR); Man Keun Kang, Seongnam-si (KR); Sang Kwon Lee, Yongin-si (KR)

(73) Assignee: SK hynix Inc., Incheon-si (KR)

( * ) Notice: Subject to any disclaimer, the term of this patent is extended or adjusted under 35 U.S.C. 154(b) by 13 days.

(21) Appl. No.: 15/041,327

(22) Filed: Feb. 11, 2016

(65) Prior Publication Data

US 2017/0133086 A1    May 11, 2017

(30) Foreign Application Priority Data

Nov. 10, 2015   (KR) .................. 10-2015-0157217

(51) Int. Cl.
*G11C 7/00*     (2006.01)
*G11C 11/406*   (2006.01)

(52) U.S. Cl.
CPC ...... *G11C 11/40626* (2013.01); *G11C 11/406* (2013.01); *G11C 11/40615* (2013.01)

(58) Field of Classification Search
CPC ............ G11C 11/406; G11C 11/40615; G11C 2211/4061
USPC .......................................... 365/222, 212, 211
See application file for complete search history.

(56) References Cited

U.S. PATENT DOCUMENTS

| 7,821,860 B2 * | 10/2010 | Yang ...................... G11C 11/406 365/211 |
| 9,007,863 B1 * | 4/2015 | Song ................. G11C 11/40615 365/212 |
| 2004/0160839 A1 * | 8/2004 | Kim ...................... G11C 11/406 365/222 |
| 2013/0031305 A1 | 1/2013 | Fujisawa |
| 2016/0225435 A1 * | 8/2016 | Lee ................... G11C 11/40626 |

FOREIGN PATENT DOCUMENTS

KR   1020110109684 A   10/2011

* cited by examiner

*Primary Examiner* — Connie Yoha
(74) *Attorney, Agent, or Firm* — William Park & Associates Ltd.

(57) ABSTRACT

A semiconductor device includes a decoded signal generation circuit suitable for executing a counting operation to generate a decoded signal in response to an oscillation signal during a refresh section, a refresh pulse generation circuit suitable for generating a refresh pulse for executing a refresh operation in response to the decoded signal and a temperature code, and a reset pulse generation circuit suitable for generating a reset pulse initializing the decoded signal in response to the refresh pulse.

20 Claims, 12 Drawing Sheets

FIG. 6

| CNT<4:1> | DS<4:1> | TC<4:1> | INTERNAL TEMPERATURE |
|---|---|---|---|
| 0 0 0 1 | 0 0 0 1 | 0 0 0 1 | 90℃ |
| 0 0 1 1 | 0 0 1 0 | 0 0 1 0 | 60℃ |
| 0 1 1 1 | 0 1 0 0 | 0 1 0 0 | 40℃ |
| 1 1 1 1 | 1 0 0 0 | 1 0 0 0 | 30℃ |

FIG. 11

| CNT<4:1> | TC<4:1> | INTERNAL TEMPERATURE |
|---|---|---|
| 0 0 0 1 | 0 0 0 1 | 90℃ |
| 0 0 1 1 | 0 0 1 0 | 60℃ |
| 0 1 1 1 | 0 1 0 0 | 40℃ |
| 1 1 1 1 | 1 0 0 0 | 30℃ | ized as time
SEMICONDUCTOR DEVICE CONFIGURED TO GENERATE A REFRESH PULSE FOR EXECUTING A REFRESH OPERATION IN RESPONSE TO THE DECODED COUNT SIGNAL AND TEMPERATURE CODE

CROSS-REFERENCE TO RELATED APPLICATIONS

The present application claims priority under 35 U.S.C 119(a) to Korean Patent Application No. 10-2015-0157217, filed on Nov. 10, 2015, which is herein incorporated by reference in its entirety.

BACKGROUND

1. Technical Field

Embodiments of the present disclosure relate to semiconductor devices, and more particularly to a semiconductor device configured to generate a refresh pulse for executing a refresh operation.

2. Related Art

Dynamic random access random (DRAM) devices of semiconductor devices may lose their stored data as time elapses even though their power supply voltages are supplied, unlike static random access random (SRAM) devices and flash memory devices. This may be due to leakage currents of cell capacitors constituting memory cells of the DRAM devices together with cell transistors. Thus, the cell capacitors of the DRAM devices have to be periodically recharged to retain or refresh their stored data. This operation may be referred to as a refresh operation. The refresh operation may be performed by activating a word line at least once within a data retention time of the memory cells to amplify the data stored in the memory cells. The data retention time may correspond to a maximum time that the cell capacitors can retain minimum charges which are required to reveal correct logic data without any refresh operations.

The refresh operation may be categorized as either an auto-refresh operation or a self-refresh operation. The auto-refresh operation may be executed by refresh commands outputted from a controller that controls the DRAM devices, and the self-refresh operation may be executed by counters included in the DRAM devices in a power down mode.

Meanwhile, it may be necessary to control operation conditions of circuit blocks in a semiconductor device according to a variation of internal temperature of the semiconductor device. Temperature sensors such as digital temperature sensor regulators (DTSRs), analog temperature sensor regulators (ATSRs) or digital temperature compensated self-refresh (DTCSRs) have been widely used to control the operation conditions of semiconductor devices such as DRAM devices according to a variation of the internal temperature of the semiconductor devices.

SUMMARY

Various embodiments are directed to semiconductor devices resetting an operation of a counter in response to a refresh pulse generated to execute a refresh operation.

According to an embodiment, a semiconductor device includes a decoded signal generation circuit suitable for executing a counting operation to generate a decoded signal in response to an oscillation signal during a refresh section, a refresh pulse generation circuit suitable for generating a refresh pulse for executing a refresh operation in response to the decoded signal and a temperature code, and a reset pulse generation circuit suitable for generating a reset pulse initializing the decoded signal in response to the refresh pulse.

According to another embodiment, a semiconductor device includes an oscillation circuit and a refresh pulse generation circuit. The oscillation circuit generates an oscillation signal in response to a refresh section signal. The refresh pulse generation circuit compares a decoded signal with a temperature code in response to the oscillation signal to generate a refresh pulse for executing a refresh operation. The decoded signal is initialized in response to the refresh pulse.

According to another embodiment, a semiconductor device includes a counter suitable for executing a counting operation in response to an oscillation signal to generate a count signal during a refresh section, a refresh pulse generation circuit suitable for generating a refresh pulse for executing a refresh operation in response to the count signal and a temperature code, and a reset pulse generation circuit suitable for generating a reset pulse initializing the count signal in response to the refresh pulse.

BRIEF DESCRIPTION OF THE DRAWINGS

Various embodiments of the present disclosure will become more apparent in view of the attached drawings and accompanying detailed description, in which:

FIG. 6 is a logic table illustrating an operation of the semiconductor device shown in FIGS. 1 to 5;

FIG. 11 is a logic table illustrating an operation of the semiconductor device shown in FIG. 10.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
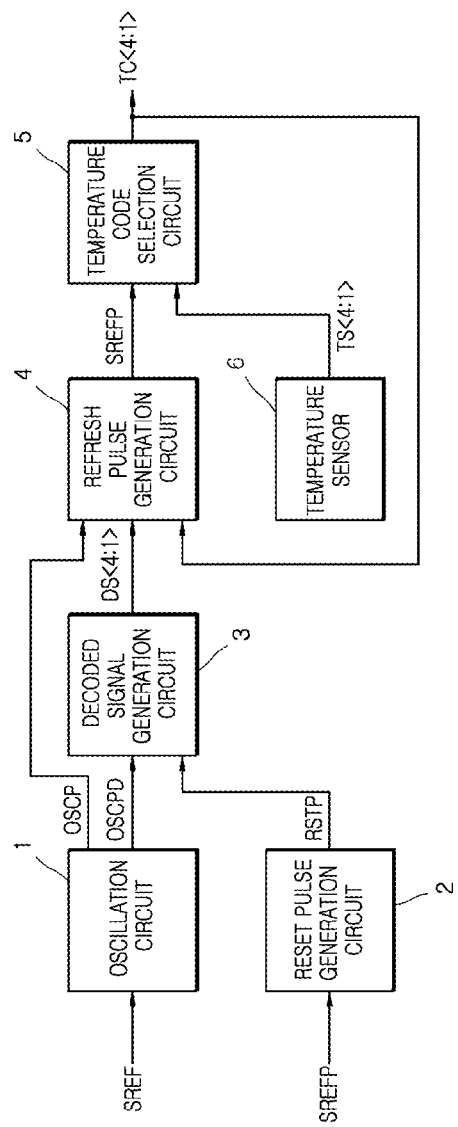
FIG. 1 is a block diagram illustrating a configuration of a semiconductor device according to an embodiment.

As illustrated in FIG. 1, a semiconductor device according to an embodiment may include an oscillation circuit 1, a reset pulse generation circuit 2, a decoded signal generation circuit 3, a refresh pulse generation circuit 4, and a temperature code selection circuit 5.

The oscillation circuit 1 may generate an oscillation signal OSCP and a delayed oscillation signal OSCPD in response to a refresh section signal SREF. More specifically, the oscillation circuit 1 may generate the oscillation signal OSCP while the refresh section signal SREF is enabled and may delay the oscillation signal OSCP by a predetermined delay time to generate the delayed oscillation signal OSCPD. The refresh section signal SREF may be set to be enabled during a refresh section. The refresh section may be set to be a time period extending from a time that a refresh mode starts until a time that the refresh mode terminates. The oscillation signal OSCP may include pulses which are periodically created during the refresh section. The predetermined delay time by which the oscillation signal OSCP is delayed for generation of the delayed oscillation signal OSCPD may be set to be different according to the embodiment. A refresh operation executing in the refresh mode may include a self-refresh operation and an auto-refresh operation.

The reset pulse generation circuit 2 may generate a reset pulse RSTP in response to receiving a refresh pulse SREFP. More specifically, the reset pulse generation circuit 2 may generate the reset pulse RSTP for initializing decoded signals DS<4:1> if the refresh pulse SREFP is created. The refresh pulse SREFP may be generated for execution of the refresh operation.

The decoded signal generation circuit 3 may generate the decoded signal DS<4:1> in response to the delayed oscillation signal OSCPD during a refresh section. More specifically, the decoded signal generation circuit 3 may execute a counting operation in synchronization with each pulse included in the delayed oscillation signal OSCPD and may execute a decoding operation to generate the decoded signal DS<4:1>.

The refresh pulse generation circuit 4 may compare the decoded signal DS<4:1> with a temperature code TC<4:1> to generate the refresh pulse SREFP, in response to the oscillation signal OSCP. More specifically, the refresh pulse generation circuit 4 may determine based on whether the decoded signal DS<4:1> corresponds with the temperature code TC<4:1> to generate the refresh pulse SREFP, whenever the pulses of the oscillation signal OSCP are inputted to the refresh pulse generation circuit 4. For example, the refresh pulse generation circuit 4 may generate the refresh pulse SREFP if the decoded signal DS<4:1> logic level corresponds with the temperature code TC<4:1> logic level. Logic levels of the decoded signal DS<4:1> and the temperature code TC<4:1> for generating the refresh pulse SREFP may be set differently according to the embodiments.

The temperature code selection circuit 5 may generate the temperature code TC<4:1> from a temperature sensing signal TS<4:1> in response to the refresh pulse SREFP. More specifically, the temperature code selection circuit 5 may output the temperature sensing signal TS<4:1> as the temperature code TC<4:1> if the refresh pulse SREFP is created. The temperature code TC<4:1> may have a logic level combination corresponding to an internal temperature of the semiconductor device. The temperature sensing signal TS<4:1> may be generated from a temperature sensor 6 included in the semiconductor device.

Figure 2:
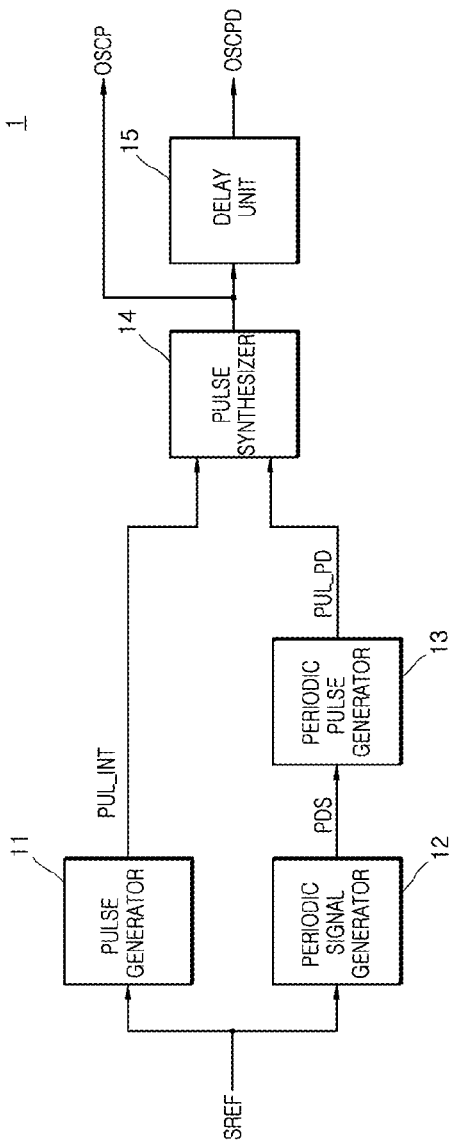
FIG. 2 is a block diagram illustrating a configuration of an oscillation circuit included in the semiconductor device of FIG. 1.

Referring to FIG. 2, the oscillation circuit 1 may include a pulse generator 11, a periodic signal generator 12, a periodic pulse generator 13, a pulse synthesizer 14, and a delay unit 15. As used herein, a unit may refer to a circuit, thus the delay unit 15 may also be referred to as a delay circuit. This is true of any other unit recited herein.

The pulse generator 11 may generate an initial pulse PUL_INT in response to the refresh section signal SREF. More specifically, the pulse generator 11 may generate the initial pulse PUL_INT in synchronization with time that the refresh section signal SREF is enabled in the refresh mode.

The periodic signal generator 12 may generate a periodic signal PDS in response to the refresh section signal SREF. More specifically, the periodic signal generator 12 may generate the periodic signal PDS during a refresh section when the refresh section signal SREF is enabled. A cycle time of the periodic signal PDS may have a predetermined cycle time which may be set different according to the embodiments.

The periodic pulse generator 13 may generate a periodic pulse signal PUL_PD in response to the periodic signal PDS. More specifically, the periodic pulse generator 13 may generate the periodic pulse signal PUL_PD including a plurality of pulses which are created in synchronization with falling edges (corresponding to level transition points which indicates that a logic "high" level is changed into a logic "low" level) of the periodic signal PDS. However, in some embodiments, the periodic pulse generator 13 may generate the periodic pulse signal PUL_PD including a plurality of pulses which are created in synchronization with rising edges (corresponding to a level transition that indicates that a logic "low" level is changed into a logic "high" level) of the periodic signal PDS.

The pulse synthesizer 14 may synthesize the initial pulse PUL_INT and the periodic pulse signal PUL_PD to generate the oscillation signal OSCP. The oscillation signal OSCP may be generated to include the initial pulse PUL_INT and the plurality of pulses of the periodic pulse signal PUL_PD.

The delay unit 15 may delay the oscillation signal OSCP by a predetermined delay time to generate the delayed oscillation signal OSCPD. The predetermined delay time by which the oscillation signal OSCP is delayed for generation of the delayed oscillation signal OSCPD may be set to be different according to the embodiments.

Figure 3:
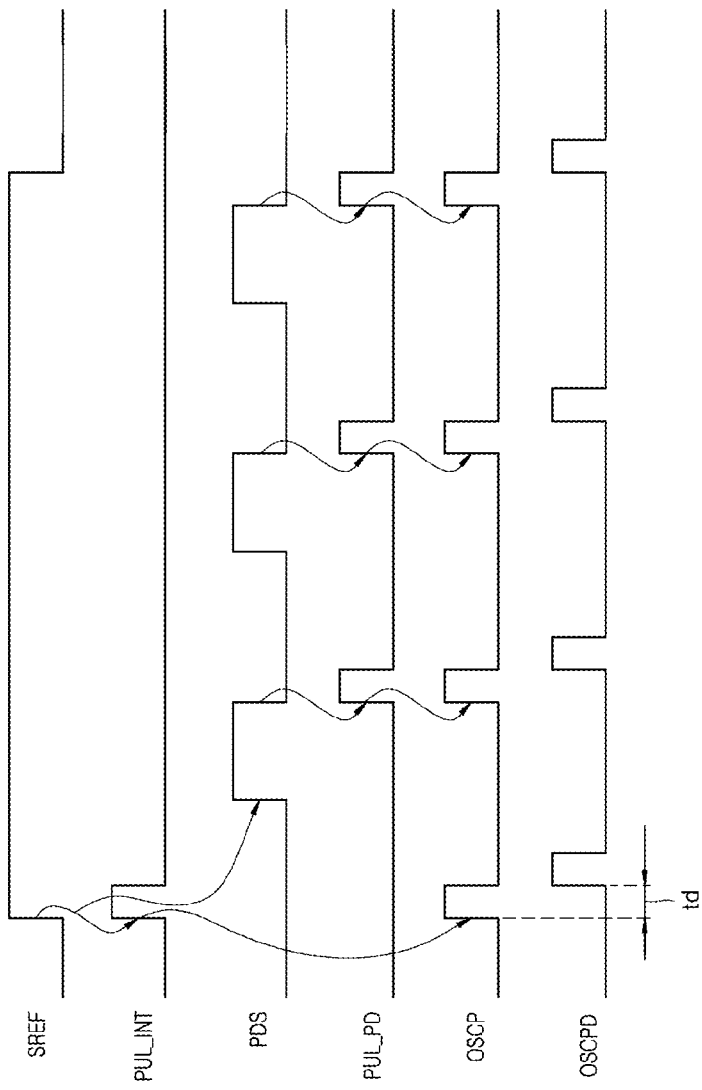
FIG. 3 is a timing diagram illustrating an operation of the oscillation circuit shown in FIG. 2.

An operation of the oscillation circuit 1 will be described more fully hereinafter with reference to FIG. 3.

If the refresh section signal SREF is enabled to have a logic "high" level to put the semiconductor device in the refresh mode, the initial pulse PUL_INT and the periodic signal PDS may be generated in synchronization with a rising edge of the refresh section signal SREF. The periodic pulse signal PUL_PD may be generated from the periodic signal PDS and may be generated to include pulses which are created in synchronization with falling edges of the periodic signal PDS.

The initial pulse PUL_INT and the periodic pulse signal PUL_PD may be synthesized to produce the oscillation signal OSCP. The oscillation signal OSCP may include the initial pulse PUL_INT and the pulses of the periodic pulse signal PUL_PD. The oscillation signal OSCP may be delayed by a predetermined delay time to produce the delayed oscillation signal OSCPD.

Figure 4:
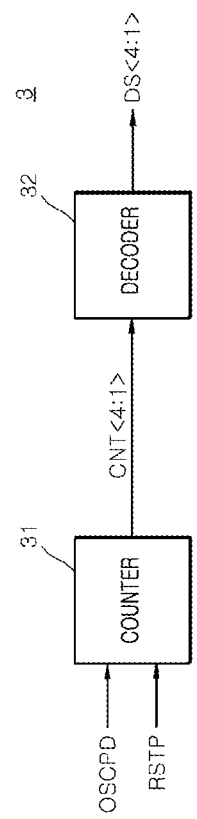
FIG. 4 is a block diagram illustrating a configuration of a decoded signal generation circuit included in the semiconductor device of FIG. 1.

Referring to FIG. 4, the decoded signal generation circuit 3 may include a counter 31, and a decoder 32.

The counter 31 may generate a count signal CNT<4:1> that is sequentially counted in response to the delayed oscillation signal OSCPD and the reset pulse RSTP. More specifically, the counter 31 may output the count signal CNT<4:1> that is counted whenever pulses of the delayed oscillation signal OSCPD are inputted to the counter 31. In the present embodiment, the counter 31 may be configured to count up the count signal CNT<4:1> bit by bit from an initial logic level combination of '0000' in sequence whenever the pulses included in the delayed oscillation signal OSCPD are inputted to the counter 31. For example, the count signal CNT<4:1> may be counted up to have a logic level combination of '0001' if a first pulse of the delayed oscillation signal OSCPD is inputted to the counter 31, the count signal CNT<4:1> may be counted up to have a logic level combination of '0010' if a second pulse of the delayed oscillation signal OSCPD is inputted to the counter 31, and the count signal CNT<4:1> may be counted up to have a logic level combination of '0011' if a third pulse of the delayed oscillation signal OSCPD is inputted to the counter 31. Because the count signal CNT<4:1> is counted up to have a logic level combination of '0010' means that only a second bit CNT<2> of the count signal CNT<4:1> has a logic "high" level and all of the remaining bits CNT<4>, CNT <3> and CNT<1> have a logic "low" level. In some embodiments, the counter 31 may be configured to count down the count signal CNT<4:1> bit by bit from an initial logic level combination of '1111' in sequence whenever pulses of the delayed oscillation signal OSCPD are inputted to the counter 31.

The decoder 32 may decode the count signal CNT<4:1> to generate the decoded signal DS<4:1>. Only a first bit DS<1> among the four bits of the decoded signal DS<4:1> may have a logic "high" level if the count signal CNT<4:1> has a logic level combination of '0001', only a second bit DS<2> among the four bits of the decoded signal DS<4:1> may have a logic "high" level if the count signal CNT<4:1> has a logic level combination of '0011', only a third bit DS<3> among the four bits of the decoded signal DS<4:1> may have a logic "high" level if the count signal CNT<4:1> has a logic level combination of '0111', and only a fourth bit DS<4> among the four bits of the decoded signal DS<4:1> may have a logic "high" level if the count signal CNT<4:1> has a logic level combination of '1111'. A logic level combination of the decoded signal DS<4:1> generated according to a logic level combination of the count signal CNT<4:1> may be set to be different according to the embodiments.

Figure 5:
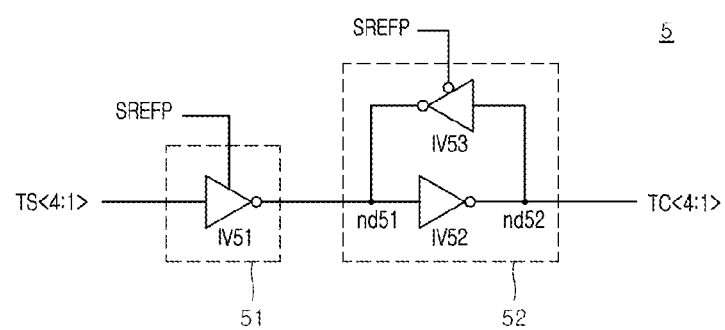
FIG. 5 is a circuit diagram illustrating a configuration of a temperature code selection circuit included in the semiconductor device of FIG. 1.

Referring to FIG. 5, the temperature code selection circuit 5 may include a buffer 51, and a latch unit 52.

The buffer 51 may include an inverter IV51. The buffer 51 may inversely buffer the temperature sensing signal TS<4:1> to output the inversely buffered signal if the refresh pulse SREFP is generated. The temperature sensing signal TS<4:1> may have a logic level combination corresponding to an internal temperature of the semiconductor device. The temperature sensing signal TS<4:1> may be generated from a temperature sensor 6 included in the semiconductor device.

The latch unit 52 may include inverters IV52 and IV53. The latch unit 52 may inversely buffer a signal of a node nd51 to which an output signal of the buffer 51 is inputted, and the latch unit 52 may output the inversely buffered signal as the temperature code TC<4:1> through a node nd52. The latch unit 52 may inversely buffer a signal of the node nd52 to output the inversely buffered signal to the node nd51 if the refresh pulse SREFP is not generated.

An operation of the semiconductor device having the aforementioned configuration will be described hereinafter with reference to FIGS. 6, 7, and 8.

If the refresh section signal SREF is enabled to put the semiconductor device in the refresh mode, the oscillation signal OSCP and the delayed oscillation signal OSCPD may be generated. The count signal CNT<4:1> may be generated by the counting operation which is executed in synchronization with the delayed oscillation signal OSCPD, and the decoded signal DS<4:1> may be generated by decoding the count signal CNT<4:1>. The decoded signal DS<4:1> may be compared with the oscillation signal OSCP in synchronization with the oscillation signal OSCP, and the refresh pulse SREFP may be generated by the comparison operation.

Referring to FIG. 6, various logic level combinations of the count signal CNT<4:1> sequentially counted in synchronization with the delayed oscillation signal OSCPD are listed in a table. Various logic level combinations of the decoded signal DS<4:1> and the temperature code TC<4:1> corresponding to the logic level combinations of the count signal CNT<4:1> are also listed in the table.

If the count signal CNT<4:1> has a logic level combination of '0001' after a counting operation, the decoded signal DS<4:1> may be generated to have a logic level combination of '0001' and the logic level combination of the decoded signal DS<4:1> may correspond with a logic level combination of the temperature code TC<4:1> corresponding to a case in which the semiconductor device has an internal temperature of 90 degrees Celsius. Thus, when the internal temperature of the semiconductor device is 90 degrees Celsius, the refresh pulse SREFP may be created if the count signal CNT<4:1> has a logic level combination of '0001'. The count signal CNT<4:1> may be initialized to have an initial logic level combination of '0000' by the reset pulse RSTP generated in synchronization with the refresh pulse SREFP.

If the count signal CNT<4:1> has a logic level combination of '0011' after a counting operation, the decoded signal DS<4:1> may be generated to have a logic level combination of '0010' and the logic level combination of the decoded signal DS<4:1> may correspond with a logic level combination of the temperature code TC<4:1> corresponding to a case in which the semiconductor device has an internal temperature of 60 degrees Celsius. Thus, when the internal temperature of the semiconductor device is 60 degrees Celsius, the refresh pulse SREFP may be created if the count signal CNT<4:1> has a logic level combination of '0011'. The count signal CNT<4:1> may be initialized to have an initial logic level combination of '0000' by the reset pulse RSTP generated in synchronization with the refresh pulse SREFP.

If the count signal CNT<4:1> has a logic level combination of '0111' after a counting operation, the decoded signal DS<4:1> may be generated to have a logic level combination of '0100' and the logic level combination of the decoded signal DS<4:1> may correspond with a logic level combination of the temperature code TC<4:1> corresponding to a case in which the semiconductor device has an internal temperature of 40 degrees Celsius. Thus, when the internal temperature of the semiconductor device is 40 degrees Celsius, the refresh pulse SREFP may be created if the count signal CNT<4:1> has a logic level combination of '0111'. The count signal CNT<4:1> may be initialized to have an initial logic level combination of '0000' by the reset pulse RSTP generated in synchronization with the refresh pulse SREFP.

If the count signal CNT<4:1> has a logic level combination of '1111' after a counting operation, the decoded signal DS<4:1> may be generated to have a logic level combination of '1000' and the logic level combination of the decoded signal DS<4:1> may correspond with a logic level combination of the temperature code TC<4:1> corresponding to a case in which the semiconductor device has an internal temperature of 30 degrees Celsius. Thus, when the internal temperature of the semiconductor device is 30 degrees Celsius, the refresh pulse SREFP may be created if the count signal CNT<4:1> has a logic level combination of '1111'. The count signal CNT<4:1> may be initialized to have an initial logic level combination of '0000' by the reset pulse RSTP generated in synchronization with the refresh pulse SREFP.

Figure 7:
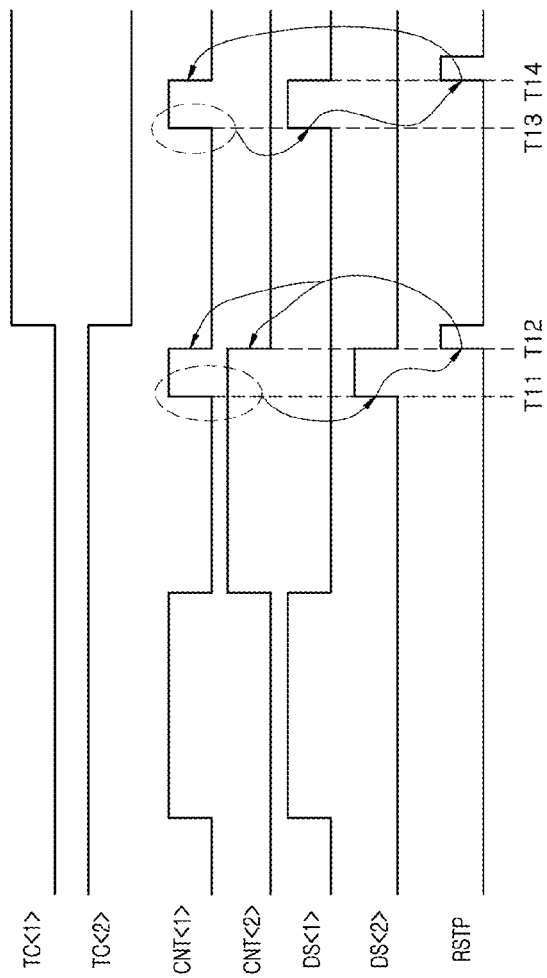
FIGS. 7 and 8 are timing diagrams illustrating an operation of the semiconductor device shown in FIGS. 1 to 5.

Referring to FIG. 7, the count signal CNT<4:1> may be initialized by the reset pulse RSTP according to various internal temperatures of the semiconductor device.

The temperature code TC<4:1> may have a logic level combination of '0010' when the internal temperature of the semiconductor device is 60 degrees Celsius. Thus, a refresh operation may be executed at a time "T11" that the count signal CNT<4:1>, after a counting operation, has a logic level combination of '0011' because logic level combinations of the decoded signal DS<2:1> and the temperature code TC<2:1> correspond with a logic level combination of '10'. The reset pulse RSTP may be created at a time "T12". At the time "T12", the temperature code TC<4:1> may be initialized to have an initial logic level combination of '0000' by the reset pulse RSTP.

The temperature code TC<4:1> may have a logic level combination of '0001' when the internal temperature of the semiconductor device is 90 degrees Celsius. Thus, a refresh operation may be executed at a time "T13" that the count signal CNT<4:1>, after a counting operation, has a logic level combination of '0001' because logic level combinations of the decoded signal DS<2:1> and the temperature code TC<2:1> correspond with a logic level combination of '01'. The reset pulse RSTP may be created at a time "T14". At the time "T14", the temperature code TC<4:1> may be initialized to have an initial logic level combination of '0000' by the reset pulse RSTP.

Figure 8:
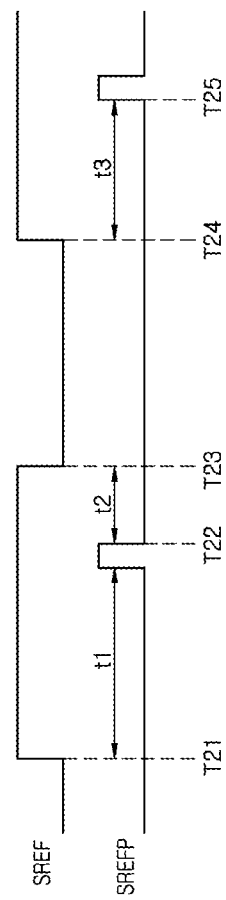

Referring to FIG. 8, the refresh operations may be executed if an entry and an exit of the refresh mode frequently occur.

If the semiconductor device enters the refresh mode at a time "T21", the count signal CNT<4:1> may be counted in sequence from an initial logic level combination until the decoded signal DS<4:1> is generated, where the decoded signal DS<4:1> has the same logic level combination as the temperature code TC<4:1> corresponding to the internal temperature of the semiconductor device. If the decoded signal DS<4:1> generated by decoding the count signal CNT<4:1> has the same logic level combination as the temperature code TC<4:1> at a time that a time period "t1" elapses from the point of time "T21", the refresh pulse SREFP may be created to execute the refresh operation. If the refresh pulse SREFP is created, the reset pulse RSTP may be created to initialize the count signal CNT<4:1>. The count signal CNT<4:1> may be counted in sequence during a time period "t2" that extends from a time "T22" after the refresh operation is executed until a time "T23" that the refresh mode terminates. A counting operation of the count signal CNT<4:1> may end from the time "T23" that the refresh mode terminates.

If the semiconductor device reenters the refresh mode at a time "T24", the count signal CNT<4:1> may be counted again. If the decoded signal DS<4:1> generated by decoding the count signal CNT<4:1> has the same logic level combination as the temperature code TC<4:1> at a time that a time period "t3" elapses from the time "T24", the refresh pulse SREFP may be created to execute the refresh operation. When the semiconductor device reenters the refresh mode, the count signal CNT<4:1> may be counted from the last logic level combination which is set by the counting operation executed in the previous refresh mode. Thus, a sum of the time period "t2" and the time period "t3" may be equal to the time period "t1".

As described above, even though the semiconductor device exits the refresh mode, the count signal CNT<4:1> may possibly not be initialized to have the last logic level combination. Thus, if the semiconductor device reenters the following refresh mode, the count signal CNT<4:1> may be counted again from the last logic level combination set in the previous refresh mode. That is, it may be unnecessary to count the count signal CNT<4:1> from an initial logic level combination whenever the semiconductor device enters the refresh mode. Accordingly, power consumption of the semiconductor device may be reduced even if the semiconductor device enters and the exits the refresh mode frequently.

Figure 9:
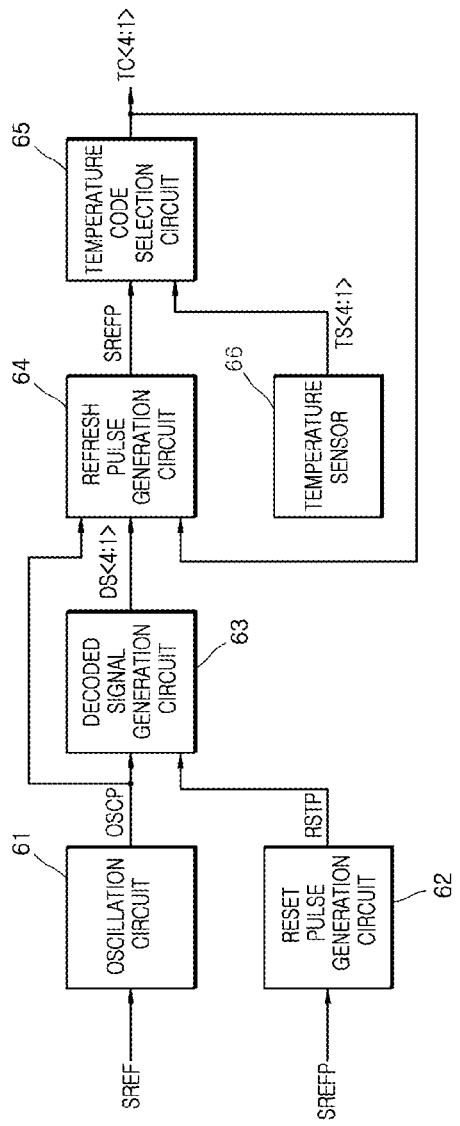
FIG. 9 is a block diagram illustrating a configuration of a semiconductor device according to another embodiment.

As illustrated in FIG. 9, a semiconductor device according to another embodiment may include an oscillation circuit 61, a reset pulse generation circuit 62, a decoded signal generation circuit 63, a refresh pulse generation circuit 64, and a temperature code selection circuit 65.

The oscillation circuit 61 may generate an oscillation signal OSCP in response to a refresh section signal SREF. More specifically, the oscillation circuit 61 may generate the oscillation signal OSCP while the refresh section signal SREF is enabled. The refresh section signal SREF may be set to be enabled during a refresh section. The oscillation signal OSCP may include pulses which are periodically created during the refresh section, that is, in a refresh mode. A refresh operation executing in the refresh mode may include a self-refresh operation and an auto-refresh operation.

The reset pulse generation circuit 62 may generate a reset pulse RSTP in response to a refresh pulse SREFP. More specifically, the reset pulse generation circuit 62 may generate the reset pulse RSTP if the refresh pulse SREFP is created. The refresh pulse SREFP may be generated for execution of the refresh operation.

The decoded signal generation circuit 63 may generate a decoded signal DS<4:1> in response to the oscillation signal OSCP. More specifically, the decoded signal generation circuit 63 may execute a counting operation in synchronization with each of pulses included in the oscillation signal OSCP and may execute a decoding operation to generate the decoded signal DS<4:1>.

The refresh pulse generation circuit 64 may compare the decoded signal DS<4:1> with a temperature code TC<4:1> to generate the refresh pulse SREFP, in response to the oscillation signal OSCP. More specifically, the refresh pulse generation circuit 64 may determine whether the decoded signal DS<4:1> logic level combination corresponds with logic level combination of the temperature code TC<4:1> to generate the refresh pulse SREFP, whenever the pulses of the oscillation signal OSCP are inputted to the refresh pulse generation circuit 64. For example, the refresh pulse generation circuit 64 may generate the refresh pulse SREFP if the decoded signal DS<4:1> corresponds with the temperature code TC<4:1>. Logic levels of the decoded signal DS<4:1> and the temperature code TC<4:1> for generating the refresh pulse SREFP may be set to be different according to the embodiments.

The temperature code selection circuit 65 may generate the temperature code TC<4:1> from a temperature sensing signal TS<4:1> in response to the refresh pulse SREFP. More specifically, the temperature code selection circuit 65 may output the temperature sensing signal TS<4:1> as the temperature code TC<4:1> if the refresh pulse SREFP is created. The temperature code TC<4:1> may have a logic level combination corresponding to an internal temperature of the semiconductor device. The temperature sensing signal TS<4:1> may be generated from a temperature sensor 66 included in the semiconductor device.

Figure 10:
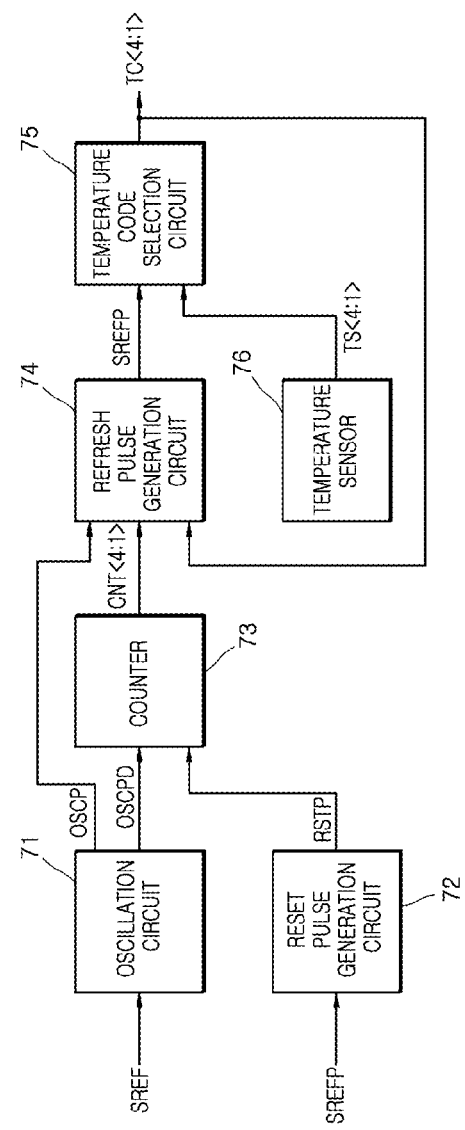
FIG. 10 is a block diagram illustrating a configuration of a semiconductor device according to yet another embodiment.

As illustrated in FIG. 10, a semiconductor device according to yet another embodiment may include an oscillation circuit 71, a reset pulse generation circuit 72, a counter 73, a refresh pulse generation circuit 74, and a temperature code selection circuit 75.

The oscillation circuit 71 may generate an oscillation signal OSCP and a delayed oscillation signal OSCPD in response to a refresh section signal SREF. More specifically, the oscillation circuit 71 may generate the oscillation signal OSCP while the refresh section signal SREF is enabled, and the oscillation circuit 71 may delay the oscillation signal OSCP by a predetermined delay time to generate the delayed oscillation signal OSCPD. The refresh section signal SREF may be set to be enabled during a refresh section. The oscillation signal OSCP may include pulses which are periodically created during the refresh section, that is, in a refresh mode. The predetermined delay time by which the oscillation signal OSCP is delayed for generation of the delayed oscillation signal OSCPD may be set differently according to the embodiments. A refresh operation executing in the refresh mode may include a self-refresh operation and an auto-refresh operation.

The reset pulse generation circuit 72 may generate a reset pulse RSTP in response to a refresh pulse SREFP. More specifically, the reset pulse generation circuit 72 may generate the reset pulse RSTP if the refresh pulse SREFP is created. The refresh pulse SREFP may be generated for execution of the refresh operation.

The counter 73 may generate a count signal CNT<4:1> in response to the delayed oscillation signal OSCPD during a refresh section. More specifically, the counter 73 may output the count signal CNT<4:1> that is sequentially counted in synchronization with pulses included in the delayed oscillation signal OSCPD.

The refresh pulse generation circuit 74 may compare the count signal CNT<4:1> with a temperature code TC<4:1> to generate the refresh pulse SREFP, in response to the oscillation signal OSCP. More specifically, the refresh pulse generation circuit 74 may determine whether the count signal CNT<4:1> corresponds with the temperature code TC<4:1> to generate the refresh pulse SREFP, whenever pulses of the oscillation signal OSCP are inputted to the refresh pulse generation circuit 74. For example, the refresh pulse generation circuit 74 may generate the refresh pulse SREFP if the count signal CNT<4:1> corresponds with the temperature code TC<4:1>. Logic levels of the count signal CNT<4:1> and the temperature code TC<4:1> for generating the refresh pulse SREFP may be set differently according to the embodiments.

The temperature code selection circuit 75 may generate the temperature code TC<4:1> from a temperature sensing signal TS<4:1> in response to the refresh pulse SREFP. More specifically, the temperature code selection circuit 75 may output the temperature sensing signal TS<4:1> as the temperature code TC<4:1> if the refresh pulse SREFP is created. The temperature code TC<1:4> may have a logic level combination corresponding to an internal temperature of the semiconductor device. The temperature sensing signal TS<4:1> may be generated from a temperature sensor 76 included in the semiconductor device.

Referring to FIG. 11, various logic level combinations of the count signal CNT<4:1> sequentially counted in synchronization with the delayed oscillation signal OSCPD are listed, and various logic level combinations of the temperature code TC<4:1> corresponding to logic level combinations of the count signal CNT<4:1> are also listed. In the present embodiment, the counter 73 may be configured to count up the count signal CNT<4:1> bit by bit from an initial logic level combination of '0000' in sequence whenever the pulses included in the delayed oscillation signal OSCPD are inputted to the counter 73. In some embodiments, the counter 73 may be configured to count down the count signal CNT<4:1> bit by bit from an initial logic level combination of '1111' in sequence whenever pulses of the delayed oscillation signal OSCPD are inputted to the counter 73.

If the count signal CNT<4:1> has a logic level combination of '0001' after a counting operation, the temperature code TC<4:1> may have a logic level combination of '0001' which corresponds to a case when the semiconductor device has an internal temperature of 90 degrees Celsius. Thus, when the internal temperature of the semiconductor device is 90 degrees Celsius, the refresh pulse SREFP may be created if the count signal CNT<4:1> has a logic level combination of '0001'. This is because the count signal CNT<4:1> having a logic level combination of '0001' corresponds to the temperature code TC<4:1> having a logic level combination of '0001'. The count signal CNT<4:1> may be initialized to have an initial logic level combination of '0000' by the reset pulse RSTP generated in synchronization with the refresh pulse SREFP.

If the count signal CNT<4:1> has a logic level combination of '0011' after a counting operation, the temperature code TC<4:1> may have a logic level combination of '0010' which corresponds to a case in which the semiconductor device has an internal temperature of 60 degrees Celsius. Thus, when the internal temperature of the semiconductor device is 60 degrees Celsius, the refresh pulse SREFP may be created if the count signal CNT<4:1> has a logic level combination of '0011'. This is because the count signal CNT<4:1> having a logic level combination of '0011' corresponds to the temperature code TC<4:1> having a logic level combination of '0010'. The count signal CNT<4:1> may be initialized to have an initial logic level combination of '0000' by the reset pulse RSTP generated in synchronization with the refresh pulse SREFP.

If the count signal CNT<4:1> has a logic level combination of '0111' after a counting operation, the temperature code TC<4:1> may have a logic level combination of '0100' which corresponds to a case in which the semiconductor device has an internal temperature of 40 degrees Celsius. Thus, when the internal temperature of the semiconductor device is 40 degrees Celsius, the refresh pulse SREFP may be created if the count signal CNT<4:1> has a logic level combination of '0111'. This is because the count signal CNT<4:1> having a logic level combination of '0111' corresponds to the temperature code TC<4:1> having a logic level combination of '0100'. The count signal CNT<4:1> may be initialized to have an initial logic level combination of '0000' by the reset pulse RSTP generated in synchronization with the refresh pulse SREFP.

If the count signal CNT<4:1> has a logic level combination of '1111' after a counting operation, the temperature code TC<4:1> may have a logic level combination of '1000' which corresponds to a case in which the semiconductor device has an internal temperature of 30 degrees Celsius. Thus, when the internal temperature of the semiconductor device is 30 degrees Celsius, the refresh pulse SREFP may be created if the count signal CNT<4:1> has a logic level combination of '1111'. This is because the count signal CNT<4:1> having a logic level combination of '1111' corresponds to the temperature code TC<4:1> having a logic level combination of '1000'. The count signal CNT<4:1> may be initialized to have an initial logic level combination of '0000' by the reset pulse RSTP generated in synchronization with the refresh pulse SREFP.

Figure 12:
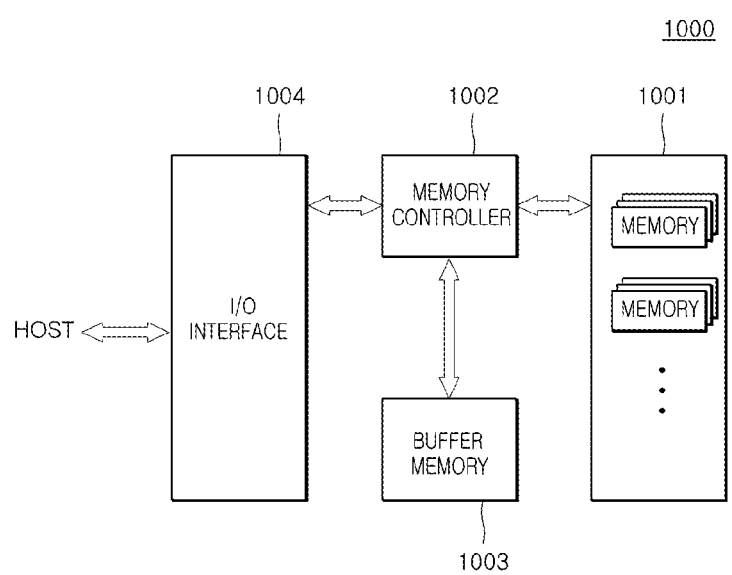
FIG. 12 is a block diagram illustrating a configuration of an electronic system including at least one of the semiconductor devices shown in FIGS. 1, 9 and 10.

At least one of the semiconductor devices described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage unit 1001, a memory controller 1002, a buffer memory 1003, and an input/output (I/O) interface 1004.

The data storage unit 1001 may store data which is outputted from the memory controller 1002 or may read and output the stored data to the memory controller 1002, according to a control signal generated from the memory controller 1002. The data storage unit 1001 may include the semiconductor device illustrated in FIG. 1, 9 or 10. Meanwhile, the data storage unit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting data stored in the data storage unit 1001 or the buffer memory 1003. Although FIG. 12 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data processed by the memory controller 1002. That is, the buffer memory 1003 may temporarily store data which is outputted from or to be inputted to the data storage unit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a decoded signal generation circuit suitable for executing a counting operation to generate a decoded signal, in response to an oscillation signal during a refresh section;
a refresh pulse generation circuit suitable for generating a refresh pulse for executing a refresh operation in response to the decoded signal and a temperature code; and
a reset pulse generation circuit suitable for generating a reset pulse initializing the decoded signal in response to the refresh pulse.

2. The semiconductor device of claim 1,
wherein the decoded signal generation circuit includes a counter suitable for generating a count signal that is sequentially counted in response to the oscillation signal; and
wherein the count signal is initialized in response to the reset pulse.

3. The semiconductor device of claim 2, wherein the counter executes the counting operation that counts up or down the count signal bit by bit from an initial logic level combination in sequence whenever pulses included in a delayed oscillation signal generated by delaying the oscillation signal are inputted to the counter.

4. The semiconductor device of claim 2, wherein the decoded signal generation circuit further includes a decoder suitable for decoding the count signal to generate the decoded signal.

5. The semiconductor device of claim 1, wherein the refresh pulse generation circuit generates the refresh pulse if the decoded signal has a logic level combination corresponding to a logic level combination of the temperature code.

6. The semiconductor device of claim 1, further comprising a temperature code selection circuit that outputs a temperature sensing signal as the temperature code in response to the refresh pulse.

7. The semiconductor device of claim 6, wherein the temperature sensing signal is generated from a temperature sensor to have a logic level combination corresponding to an internal temperature of the semiconductor device.

8. The semiconductor device of claim 1, further comprising:
a pulse generator suitable for generating an initial pulse in response to a refresh section signal enabled during the refresh section;
a periodic signal generator suitable for generating a periodic signal having a predetermined cycle time during the refresh section;
a periodic pulse generator suitable for creating a periodic pulse signal in response to the periodic signal; and a pulse synthesizer suitable for synthesizing the initial pulse and the periodic pulse signal to generate the oscillation signal.

9. The semiconductor device of claim 8, further comprising a delay unit suitable for delaying the oscillation signal to generate a delayed oscillation signal.

10. A semiconductor device comprising:
an oscillation circuit suitable for generating an oscillation signal in response to a refresh section signal; and
a refresh pulse generation circuit suitable for comparing a decoded signal with a temperature code in response to the oscillation signal to generate a refresh pulse for executing a refresh operation,
wherein the decoded signal is initialized in response to the refresh pulse.

11. The semiconductor device of claim 10, wherein the refresh section signal is enabled during a refresh section.

12. The semiconductor device of claim 10, wherein the oscillation circuit includes:
a pulse generator suitable for generating an initial pulse in response to the refresh section signal;
a periodic signal generator suitable for generating a periodic signal having a predetermined cycle time in response to the refresh section signal;
a periodic pulse generator suitable for creating a periodic pulse signal in response to the periodic signal; and
a pulse synthesizer suitable for synthesizing the initial pulse and the periodic pulse signal to generate the oscillation signal.

13. The semiconductor device of claim 12, wherein the oscillation circuit further includes a delay unit suitable for delaying the oscillation signal to generate a delayed oscillation signal.

14. The semiconductor device of claim 10, wherein the refresh pulse generation circuit generates the refresh pulse if the decoded signal has a logic level combination corresponding to a logic level combination of the temperature code.

15. The semiconductor device of claim 10, further comprising a temperature code selection circuit suitable for outputting a temperature sensing signal generated from a temperature sensor as the temperature code in response to the refresh pulse so that the temperature code has a logic level combination corresponding to an internal temperature.

16. The semiconductor device of claim 10, further comprising a counter suitable for generating a count signal that is sequentially counted in response to the oscillation signal,
wherein the count signal is initialized in response to the reset pulse.

17. The semiconductor device of claim 16, wherein the counter executes a counting operation that counts up or down the count signal bit by bit from an initial logic level combination in sequence whenever pulses included in a delayed oscillation signal generated by delaying the oscillation signal are inputted to the counter.

18. The semiconductor device of claim 16, further comprising a decoder suitable for decoding the count signal to generate the decoded signal.

19. A semiconductor device comprising:
a counter suitable for executing a counting operation in response to an oscillation signal to generate a count signal during a refresh section;
a refresh pulse generation circuit suitable for generating a refresh pulse for executing a refresh operation in response to the count signal and a temperature code; and
a reset pulse generation circuit suitable for generating a reset pulse initializing the count signal in response to the refresh pulse.

20. The semiconductor device of claim 19, wherein the counter executes the counting operation that counts up or down the count signal bit by bit from an initial logic level combination in sequence whenever pulses included in a delayed oscillation signal generated by delaying the oscillation signal are inputted to the counter.

* * * * *